(12) United States Patent
Bruebach

(10) Patent No.: US 7,230,678 B2
(45) Date of Patent: Jun. 12, 2007

(54) LITHOGRAPHIC APPARATUS, DEVICE MANUFACTURING METHOD, AND DEVICE MANUFACTURED THEREBY

(75) Inventor: Joerg Bruebach, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 237 days.

(21) Appl. No.: 10/925,214

(22) Filed: Aug. 25, 2004

(65) Prior Publication Data

US 2005/0078292 A1 Apr. 14, 2005

(30) Foreign Application Priority Data

Aug. 29, 2003 (EP) .................................. 03077702

(51) Int. Cl.
*G03B 27/32* (2006.01)
*G03B 27/54* (2006.01)
*G03B 27/72* (2006.01)
(52) U.S. Cl. .............................. 355/71; 355/67; 355/77
(58) Field of Classification Search .................. 355/53, 355/67, 71, 77
See application file for complete search history.

(56) References Cited

U.S. PATENT DOCUMENTS

| | | |
|---|---|---|
| 4,937,619 A | 6/1990 | Fukuda et al. |
| 5,303,002 A | 4/1994 | Yan |
| 5,372,901 A | 12/1994 | Rolfson et al. |
| 5,739,898 A | 4/1998 | Ozawa et al. |
| 2001/0026448 A1 | 10/2001 | Koizumi et al. ............ 362/268 |
| 2002/0048288 A1 | 4/2002 | Kroyan et al. |
| 2002/0186741 A1 | 12/2002 | Kleinschmidt et al. |
| 2003/0099040 A1 | 5/2003 | Singer et al. |
| 2003/0197846 A1* | 10/2003 | Coston et al. ................ 355/67 |
| 2004/0135982 A1* | 7/2004 | Kluter ......................... 355/67 |
| 2004/0233411 A1* | 11/2004 | Shiraishi ...................... 355/67 |
| 2005/0275818 A1* | 12/2005 | Singer ......................... 355/55 |

\* cited by examiner

*Primary Examiner*—Rodney Fuller
(74) *Attorney, Agent, or Firm*—Pillsbury Winthrop Shaw Pittman LLP

(57) ABSTRACT

A lithographic apparatus includes an illumination system for conditioning a projection beam of radiation including components having a first radiation component having a first wavelength and a second radiation component having a second wavelength for reproducing features patterned on a mask. The lithographic apparatus includes an illumination system having an adjustable filter for filtering said beam of radiation, arranged in use, to selectively adjust the proportion of said second radiation component in said beam. Embodiments of the apparatus provide reproduction of both isolated and dense features patterned on the mask.

21 Claims, 5 Drawing Sheets

LITHOGRAPHIC APPARATUS, DEVICE MANUFACTURING METHOD, AND DEVICE MANUFACTURED THEREBY

This application claims the benefit of priority from European patent application No. 03077702.3, filed Aug. 29, 2003, the entire content of which is incorporated herein by reference.

BACKGROUND OF THE INVENTION

1. Field of the Invention

The present invention relates to a lithographic apparatus including an illumination system for conditioning a projection beam of radiation, said beam of radiation including a first radiation component having a first wavelength and a second radiation component having a second wavelength, a support structure for supporting a patterning device, the patterning device serving to pattern the projection beam according to a desired pattern, a substrate table for holding a substrate, a projection system for projecting the patterned beam onto a target portion of the substrate.

2. Background of the Related Art

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning devices include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic circuitry. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096. In the case of a programmable mirror array, the said support structure may be embodied as a frame or table, for example, which may be fixed or movable as required; and A programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as hereabove set forth.

Lithographic apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or antiparallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792.

In a manufacturing process using a lithographic apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Microchip fabrication involves the control of tolerances of a space or a width between devices and interconnecting lines, or between features, and/or between elements of a feature such as, for example, two edges of a feature. In particular the control of space tolerance of the smallest of such spaces permitted in the fabrication of the device or IC layer is of importance. Said smallest space and/or smallest width is referred to as the critical dimension ("CD").

For the sake of simplicity, the projection system may hereinafter be referred to as the "lens"; however, this term should be broadly interpreted as encompassing various types of projection system, including refractive optics, reflective optics, and catadioptric systems, for example. The illumination system may also include components operating according to any of these design types for directing, shaping or controlling the projection beam, and such components may also be referred to below, collectively or singularly, as a "lens". The illumination system as well as the projection system generally comprise components for directing, shaping or controlling the projection beam of radiation. Generally, the projection system comprises optical elements adjustable to set the numerical aperture (commonly referred to as the "NA") of the projection system. For example, an adjustable NA-diaphragm is provided in a pupil of the projection system. The illumination system typically comprises adjustable elements for setting the outer and/or inner radial extent (commonly referred to as σ-outer and σ-inner, respectively) of the intensity distribution upstream of the mask (in a pupil of the illumination system). Controlling the spatial intensity distribution at a pupil plane of the illumination system can be done to improve the processing parameters when an image of the illuminated object is projected onto a substrate.

Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791.

Developments in projection lithographic techniques for improving image resolution conventionally involved an increase of numerical aperture. Such an increase leads to a reduction of depth of focus, and therefore there is the problem of maintaining sufficient "process latitude" (i.e., sufficient depth of focus and sufficient insensitivity to residual errors in the dose of exposure of irradiated target portions). In particular, one problem with conventional projection lithographic techniques is the occurrence of a variance in CD for isolated features and dense features. This problem arises because features on the mask (also referred to as reticle) having the same nominal critical dimensions will print differently depending on their pitch on the mask (i.e. the separation between adjacent features) due to pitch dependent diffraction effects. For example, a feature consisting of a line having a particular line width when in isolation, i.e. having a large pitch, will print differently from the same feature having the same line width when together with other lines of the same line width in a dense arrangement on the mask, i.e. having small pitch. Hence, when both dense and isolated features of critical dimension are to be printed simultaneously, a pitch dependent variation of printed CD is observed. This phenomenon is called "iso-dense bias", and is a particular problem in photolithographic techniques.

Conventional lithographic apparatuses do not directly address the problem of iso-dense bias. Conventionally, it is the responsibility of the users of conventional lithographic apparatuses to attempt to compensate for the iso-dense bias by either changing the apparatus' optical parameters, such as the numerical aperture of the projection lens or the σ-outer and σ-inner optimisation, or by designing the mask in a such a way that differences in dimensions of printed isolated and dense features are minimised. This last technique may for example involve reticle oversizing and/or optical proximity correction.

Thus, conventional lithographic apparatuses suffer from the problem that user's of the apparatus are required to adapt the systems to suit their own needs. This is inconvenient, time consuming and costly in terms of personnel and lost production while the apparatus or masks are being adapted. Further, although it is possible to design a mask to produce an optimized print for one application, for second application, it may be necessary to produce a second mask optimized to take into account the particular requirements of the different application. This adds further to the cost and inconvenience.

SUMMARY OF THE INVENTION

One aspect of an embodiment of the invention provides a lithographic apparatus, which overcomes the problems identified above, in particular, to improve the reproducibility of mask features.

Another aspect of embodiments of the invention of the invention provides a lithographic apparatus having an improved iso-dense bias.

According to embodiments of the invention, these and other aspects are achieved in a lithographic apparatus including and illumination system having an adjustable filter for filtering a beam of radiation, arranged in use, to selectively adjust the proportion of said second radiation component in said beam.

This arrangement can result in an improvement in the reproducibility of certain mask features, in particular, isolated and dense features. The inventors of the present invention have found that this is achieved by selectively adjusting the spectral characteristics of the projection beam. In general in projection photolithography sources are used whereby the spectral distribution of radiation energy over wavelength is strongly peaked at a single central wavelength. Only for sufficiently narrow bandwidths of the spectral distribution it is possible to avoid chromatic aberrations of the projection lens to become out of tolerance. Nevertheless, a substantially monochromatic radiation source typically generates, besides a spectral distribution of radiation of (for projection lithography sufficiently small but) finite bandwidth comprising most of the radiation energy of the projection beam, a second spectral band of radiation of larger bandwidth comprising a relatively small fraction of the radiation energy of the projection beam. Such a second spectral band of radiation may for example be induced by fluorescence or phosphorescence in optical elements which are part of the source or the illumination system, or for example by spontaneous emission due to an excitation of energy states of radiation emitting material comprised by, for example, the source.

In the context of the present description and claims, said first radiation component having a first wavelength refers to radiation with a wavelength within the narrow spectral band centered at said central wavelength where this narrow spectral band comprises most of the radiation energy of the projection beam. Similarly, said second radiation component having a second wavelength refers to radiation with a wavelength within said second spectral band of radiation of larger bandwidth comprising a relatively small fraction of the radiation energy of the projection beam. The wavelengths occurring in the second radiation component may comprise wavelengths from the whole range of wavelengths in the second spectral band, but may also be limited to a range much smaller than the width of the second spectral band. Whereas in general, such spurious radiation with wavelengths within the second spectral band is filtered out of the projection beam (to avoid chromatic aberrations beyond tolerance), the inventors have found that radiation from said second spectral band can be used to affect the amount of iso dense bias.

An aerial image of a pattern is primarily formed by radiation of the first radiation component, since it comprises most of the radiation energy. The radiation of the second radiation component causes a veiling glare type intensity distribution component on top of the aerial image as formed by the first radiation component. This veiling glare affects the position of feature edges as printed. A position of a feature edge as printed is determined by the resist threshold intensity in combination with the spatial aerial-image intensity-distribution. A change of position of a feature edge as printed, in accordance with an amount of veiling glare intensity, depends on the slope of the spatial intensity pattern at the aerial image of the feature edge. This slope generally is different for isolated features and dense features, and therefore feature edge positions can be affected differently by adjusting the proportion of the second radiation component. In particular, by adjusting the proportion of the second radiation component, the spectral characteristic of the projection beam can be changed such that iso-dense bias is improved. The inventors have found that, rather than trying to eliminate broadband background radiation from the laser beam, by providing mechanisms to adjust the amount of a component of broadband radiation in the radiation beam one can actually reduce CD variations when printing both isolated and dense features of critical dimension simultaneously.

In one embodiment, said adjustable filter is a spatial filter disposed at a location in use traversed by said projection beam of radiation.

In a further embodiment, said adjustable filter is a spectral filter.

By providing either a spatial filter of a spectral filter the projection beam can be tuned in a highly selective yet straightforward manner to avoid the problems of iso dense bias. Since such spatial and spectral filters are adaptable to be arranged in confined spaces, the apparatus can be adapted without having to substantially rearrange existing components, without adding further complexity to the apparatus and without the need of additional beam processing components.

According to a second aspect of the invention, there is provided an illumination system for use in a lithographic apparatus for receiving a beam of radiation, said beam of radiation including a first radiation component at a first wavelength and a second radiation component at a second wavelength; and including an adjustable filter for filtering said beam of radiation, arranged in use, to selectively adjust the proportion of said second radiation component in said beam.

According to a third aspect of the invention there is provided a device manufacturing method including providing a substrate that is at least partially covered by a layer of radiation-sensitive material, providing a projection beam of radiation including a first radiation component at a first wavelength and a second radiation component at a second wavelength component using an illumination system, using a patterning device to endow the projection beam with a pattern in its cross-section; and projecting the patterned beam of radiation onto a target portion of the layer of radiation-sensitive material, and including providing in said illumination system an adjustable filter for filtering said beam of radiation, and using said adjustable filter to selectively adjust the proportion of said second radiation component in said beam.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively. In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5–20 nm).

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF EMBODIMENTS OF THE INVENTION

Figure 1:
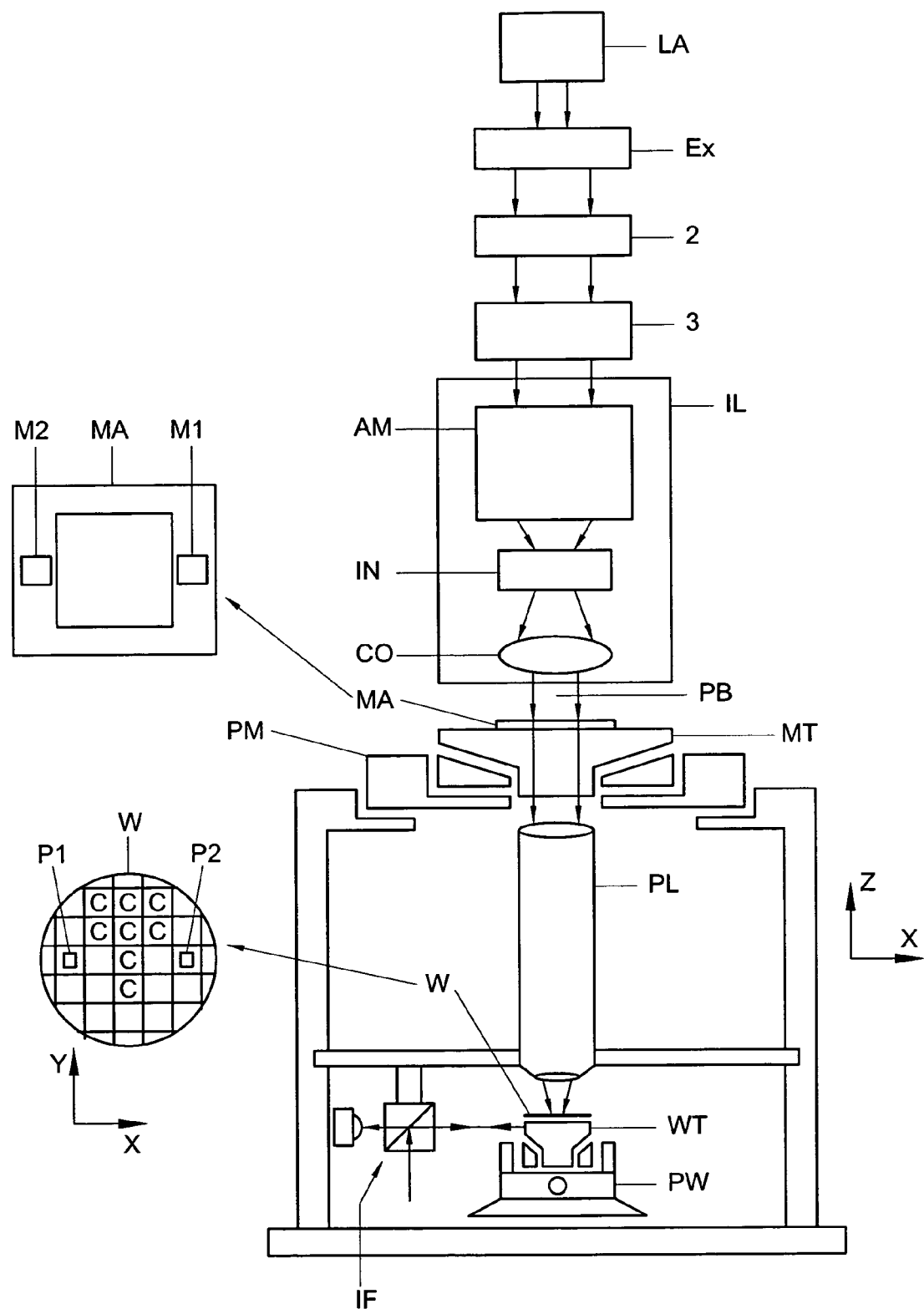
FIG. 1 schematically depicts a lithographic apparatus according to the invention.

FIG. 1 schematically depicts a lithographic apparatus according to a particular embodiment of the invention. The apparatus comprises: 1 an illumination system Ex, IL, 2 and 3 for supplying a projection beam PB of radiation (e.g. light in the deep ultraviolet region). In this particular case, the illumination system also comprises a radiation source LA;

a first object table (mask table) MT provided with a mask holder for holding a mask MA (e.g. a reticle), and connected to first positioner PM for accurately positioning the mask with respect to item PL;

a second object table (substrate table) WT provided with a substrate holder for holding a substrate W (e.g. a resist coated silicon wafer), and connected to second positioner PW for accurately positioning the substrate with respect to item PL; and a projection system ("lens") PL for imaging an irradiated portion of the mask MA onto a target portion C (e.g. comprising one or more dies) of the substrate W.

As here depicted, the apparatus is of a transmissive type (i.e. employing a transmissive mask). However, in general, it may also be of a reflective type, for example employing a programmable mirror array of a type as referred to above.

The source LA (e.g. an excimer laser source) produces a beam of radiation. This beam is fed into a beam delivery system 2 either directly or after having traversed conditioning optical elements, such as a beam expander Ex, for example. The beam is guided from the source LA to the illumination unit IL by the beam delivery system 2, which generally includes one or more directing mirrors.

In the illumination unit IL the beam is guided into an adjustable optical element AM for setting the outer and/or inner radial extent (commonly referred to as σ-outer and σ-inner, respectively) of the intensity distribution of the beam in a pupil plane of the illumination system. The beam is then directed to further elements of the illumination unit IL, such as the integrator IN and condensor CO.

The illumination system including the expander unit Ex and illumination unit IL, performs the function of ensuring that the beam PB impinging on the mask MA has a desired uniformity and intensity distribution in its cross-section.

The illumination system also includes a filtering unit 3. In FIG. 1 the filtering unit 3 is disposed downstream of the beam delivery system 2, between the conditioner Ex and the illumination unit IL. However, the invention is not limited in this respect, and it is envisaged that the filtering unit 3 may be disposed at any location within the illumination system. In particular, the beam delivery system 2 may comprise the filtering unit 3. The filtering unit 3 includes a filter for providing spectral or spatial filtering of the beam.

The illumination system, and in particular the filtering unit 3, in accordance with the present invention, is described in further detail with reference to FIGS. 2 and 5.

It should be noted with regard to FIG. 1 that the source LA may be within the housing of the lithographic apparatus (as is often the case when the source LA is a mercury lamp, for example), but that it may also be remote from the lithographic apparatus, the radiation beam which it produces being led into the apparatus (e.g. with the aid of suitable directing mirrors comprised by the beam delivery systen 2); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioner PW and interferometer IF, the substrate table WT can be moved accurately, e.g. so as to position different target portions C in the path of the beam PB. Similarly, the first positioner PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The illumination system is now described in further detail with reference to FIG. 2.

The illumination system LA, Ex, IL, 2, 3 adjusts the position and composition of the projection beam prior to its incidence on the patterning device.

Figure 2:
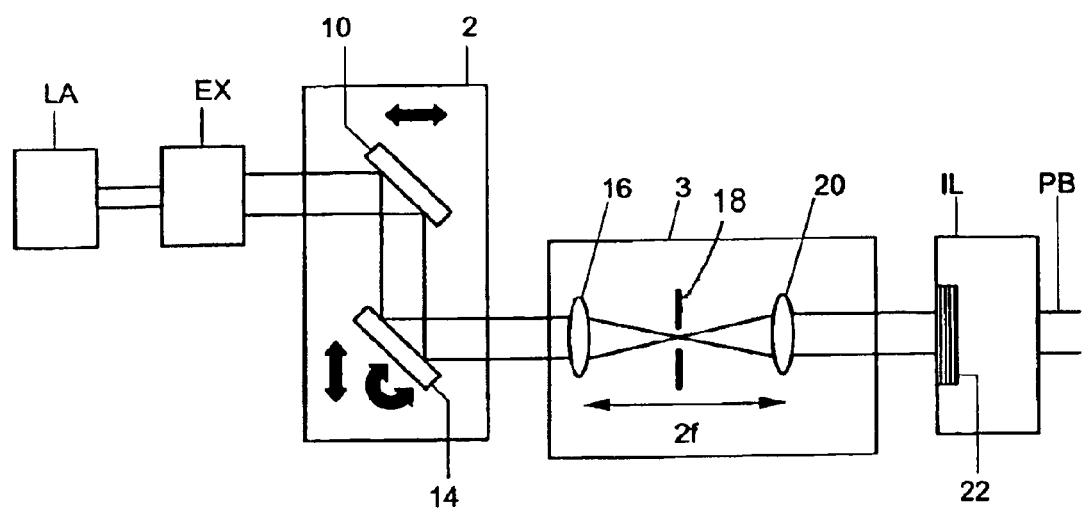
FIG. 2 schematically depicts the radiation source and some elements of the illumination system according to a first embodiment of the invention.

In FIG. 2, the radiation source LA is a deep ultraviolet (DUV) excimer laser, although the invention is also applicable to other radiation sources.

On exiting the radiation source LA, the beam may be conditioned by an optional beam expander Ex, which is a unit for adjusting the beam diameter in X- and Y-directions. The optical output beam emanating from the beam expander unit Ex is arranged to be incident on the beam delivery system 2. The beam delivery system 2 delivers the (optionally) conditioned beam to an optical entrance element 22 of the illuminator unit IL. The optical entrance element 22 of the illuminator IL may for example be embodied as a light scattering element for increasing the etendue (or light-conductance value) of the radiation beam traversing this element It is important to control the angular as well as spatial radiation distribution in an image plane perpendicular to the optical axis located at the position of the entrance element 22 because it affects the angular and spatial radiation distribution incident on the mask.

Steering mirror 10 located furthest from the image plane 22 is referred to as the positioning mirror and is translatable in the X direction. It is referred to as the positioning mirror because translation of mirror 10 performs beam position changes at the image plane 22. A second mirror 14 is disposed to receive the light reflected by mirror 10. Mirror 14 is translatable in the Y direction and rotatable around its vertical axis. Adjustment of mirror 14 causes both pointing and positioning of the radiation beam at the image plane 22.

Mirror 14 is preferably disposed a certain distance from image plane 22, in which case pointing correction performed by this mirror will not result in any unwanted position changes at image plane 22.

In FIG. 2, the filter 3 is disposed between the beam delivery system 2 and the illumination unit IL. As mentioned previously, however, the invention is not limited in this respect. The adjustable filter 3 includes lenses 16, 20 and a spatial filter 18. The two lenses 16 and 20 are provided in the path of the beam. Lenses 16, 20 are disposed such that the optical system formed by the lenses 16 and 20 is substantially confocal. At the common focus of the lenses 16 and 20 a spatial filter 18 is provided. The spatial filter is adjustable; it may for instance be movable along the optical axis in either direction, away from the common focus. The spatial filter may be embodied as a pinhole or a diaphragm featuring a transmissive area surrounded by an absorptive area, and the absorptive area may be embodied, for example, as a grey tone dithered pattern of absorptive pixels. The projection beam incident on the spatial filter comprises radiation having at least two different wavelengths. As explained above, the spectral distribution of radiation energy over wavelength of the projection beam is strongly peaked at a first central wavelength, said spectral peak comprising most of the radiation energy of the projection beam, and further features a second spectral band of radiation of larger bandwidth comprising a relatively small fraction of the radiation energy of the projection beam. The purpose of the spatial filter is to adjust the amount of a second radiation component with wavelengths in said second spectral band. To that purpose, one can, for example, exploit the presence of longitudinal chromatic aberration due to dispersion of the optical material present in lens 16. This aberration causes the focus of the radiation component peaked at the first wavelength (the "first radiation component") to be separated along the optical axis from the focus of the second radiation component. The second radiation component is out of focus at the plane where the first radiation component is in focus (this plane will be referred to hereinafter as the "first focal plane"), and hence, a pinhole located in the first focal plane will block part of the second radiation component. By moving the pinhole along the optical axis, the fraction of the second radiation component that is blocked by the pinhole is changing. This in turn enables a tuning of the proportion of the second radiation component in the beam downstream of the pinhole and consequently, in the projection beam impinging on the patterning device.

Instead of exploiting longitudinal chromatic aberration, transverse chromatic aberration due to, for example, the presence of a wedge of dispersive optical material in or near to lens 16 can be used to obtain separate focus points of the first and second radiation component. In such an embodiment, a lateral displacement of the spatial filter, as described above, in a direction along a line connecting the separate focus points affects the proportion of the second radiation component in the projection beam. By tuning the proportion of the second radiation component, the phenomenon of iso-dense bias can be affected and minimized.

It has been found that the imaging parameter iso-dense bias, as well as being affected by those factors discussed above, is affected by the laser's spectral properties. In particular, it has been found, contrary to convention that by adjusting the spectral characteristics of the projection beam iso-dense bias is improved. Radiation sources' output, in particular excimer laser sources' output includes a narrow band peak component at a first wavelength and side bands at different wavelengths together with a broad band photoluminesence background component called Amplified Spontaneous Emission (ASE) over a range of second wavelengths. For applications using narrowband lasers, ASE is often a problem because the residual ASE wavelength components lying far away from the centre of the narrowband wavelength of the laser spectrum can cause a dilution of an image of a pattern, as projected by the projection system PL on the substrate. The present inventors however, have realised that by adjusting the amount of ASE in the projection beam, the iso-dense bias can be adjusted from virtually zero up to about a micrometre depending on the lithographic apparatus used.

In particular, the inventors have found that, rather than trying to eliminate broadband background radiation from the laser beam, by providing ways to adjust the amount of a component of broadband radiation in the beam the iso-dense bias can be reduced by applying adjustments.

Adjusting the amount of ASE present in the projection beam poses problems because ASE is highly divergent. In order to address this problem, lens 16 is provided in the path of the projection beam. The lens causes the first wavelength of the projection beam to converge at a location. The first wavelength component includes the highly coherent narrow band laser generated radiation. Also, but however to a much lesser extent, lens 16 focuses the ASE and other wavelength components, such as side bands. The spatial filter is optionally disposed a distance equal to the focal length of lens 16. The spatial filter is adjusted to allow the focused first component wavelength to pass while allowing only a proportion of the other wavelength components of the projection beam to pass. This is achieved because at the location of the spatial filter a lower proportion of other wavelength components are present because the divergent ASE will not be as effectively focused as laser light components, and other laser light components, such as any side bands will have their focus at a location that differs from the focal point of the first radiation component, due to chromatic aberration.

The amount of ASE in the beam leaving the filter is thus determined by the lens and the spatial filter.

In addition, the position of the spatial filter within the illumination system plays a role. Within the laser device, ASE cannot be tuned because ASE is necessary to start lasing action in the laser cavity. Further, as mentioned above ASE is highly divergent and propagates differently through the illumination system. The inventors have realised that by providing filtering in the illumination system the amount of ASE in the projection beam can be adjusted without affecting the lasing function of the laser.

Preferably, the spatial filter is a pinhole (or diaphragm) with an adjustable aperture. The pinhole is calibrated so that for a given aperture, the projection beam comprises a certain percentage of integrated ASE. The wider the aperture the larger the percentage of integrated ASE in the projection beam. The pinhole is constructed preferably from a reflective material to prevent the pinhole structure from becoming very hot due to radiation absorbed by the absorptive part of the pinhole.

The pinhole is adjusted in the following way: depending on the apparatus used (refer below to FIG. 3), the percentage of ASE required to achieve an iso-dense bias as close to zero as possible is determined. The calibrated pinhole is then either opened or closed to give the aperture, which allows that percentage of ASE to pass in the projection beam (an example, eg. aperture size for a particular projection beam is needed).

The consequence of adjusting the amount of a second radiation component in the projection beam is that the iso-dense bias is improved, i.e. features of line width CD are accurately printed regardless of whether they are printed in isolation (with large pitch) or densely (with small pitch). The reason for this is that, in the presence of the second radiation component in the projection beam, the contrast of an aerial image of a pattern is slightly degraded (compared to the contrast in the absence of the second radiation component) due to chromatic aberration in the projection lens. The loss of contrast is adjustable, as explained above, and the blurring due to loss of contrast affects the position of printed feature edges of isolated and dense features differently. The actual difference in effect on printed position (and hence, on CD) is in accordance with the difference of the slope of the spatial intensity pattern at the aerial image of said feature edges.

Figure 3:
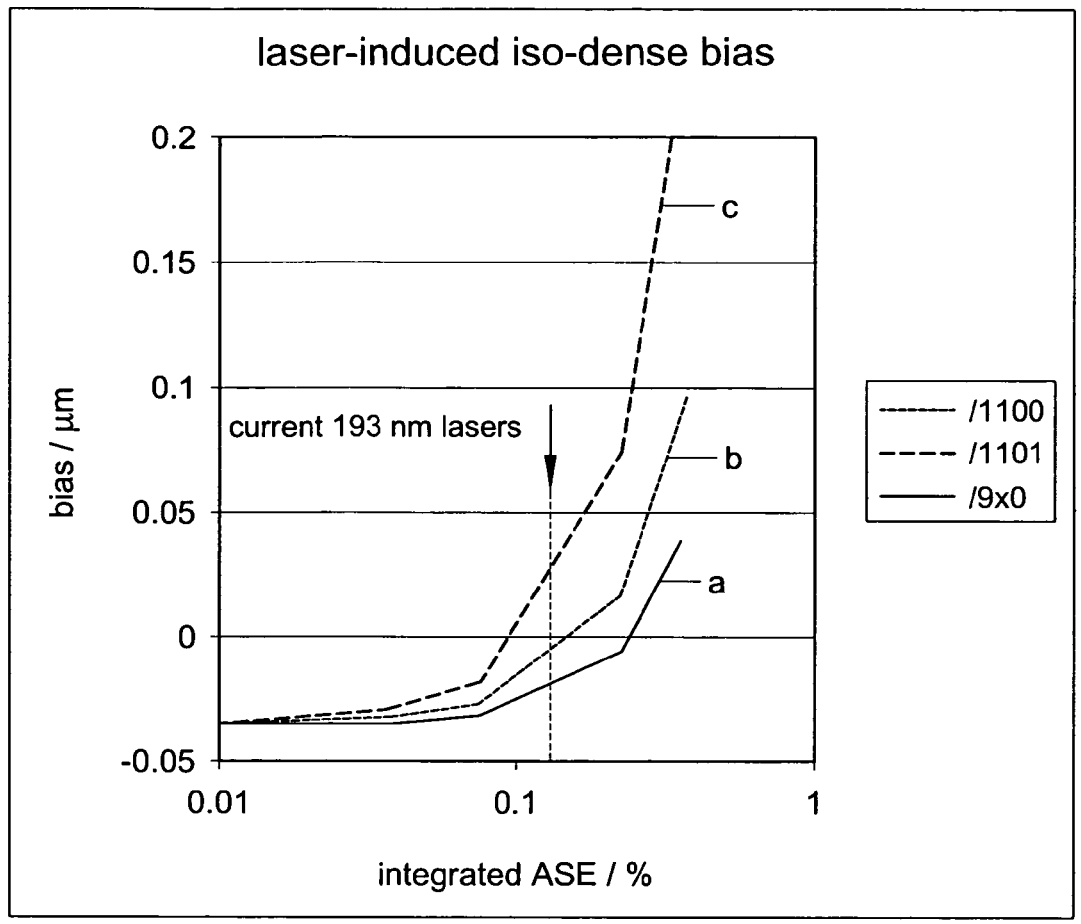
FIG. 3 shows a plot of the iso-dense bias against the percentage of the integrated amplified spontaneous emission of the projection beam.

FIG. 3 is a graph showing the results of the present invention. In particular, FIG. 3 is a plot showing the relationship between the amount of ASE in the laser beam and the measured iso-dense bias of the printed features. The x-axis shows in log to base 10 the integrated ASE component as a percentage of the projection beam. Here "integrated" indicates that the second radiation component comprises substantially all wavelengths within the spectral band typical for ASE. The y-axis shows the iso-dense bias of the resulting image in micrometers (i.e. the difference in CD for isolated and dense features as measured in micrometers). Line a shows the results obtained in a 193 nm NA 0.6 lithography apparatus, line b shows the results obtained in a 193 nm NA 0.70 apparatus, and line c shows the results obtained in a 193 nm NA 0.75 apparatus. It is commented that the gradient of the lines is determined by the optical parameters of each apparatus, in particular, by the numerical aperture and the sigma optimisation of each apparatus.

It is seen, that iso-dense bias induced by the laser spectral characteristics is marked. In particular, the percentage of ASE in the beam has a marked effect on the iso-dense bias. Optimally, the apparatuses are operated with zero iso-dense bias, as this yields a true reproduction of the mask in terms of the reproduction of features in isolation and in dense configurations. Thus, where the lines a, b and c cross the x-axis indicates the desired percentage of integrated ASE. The fact that the lines for each apparatus cross the x-axis at different points is due, as mentioned above to the different optical parameters of each apparatus.

It is seen from FIG. 3 that in a conventional lithographic apparatus where the laser beam is not processed according to the present invention, a beam in the deep ultraviolet (DUV) at 193 nanometers having an integrated ASE percentage of less than 0.01 results in an iso-dense bias of 0.03 micrometres. From the steep slopes at increased integrated values of the second radiation component (exploiting ASE) in FIG. 3 it is clear that the present invention provides a very sensitive tuning mechanism for tuning (and zeroing) iso dense bias.

If the results from the different lithography apparatuses are compared it is seen that each apparatus has a different iso-dense bias/proportion of second radiation component characteristic. This is a result of other machine dependent factors, which vary from machine to machine, and which contribute to iso-dense bias.

Figure 4:
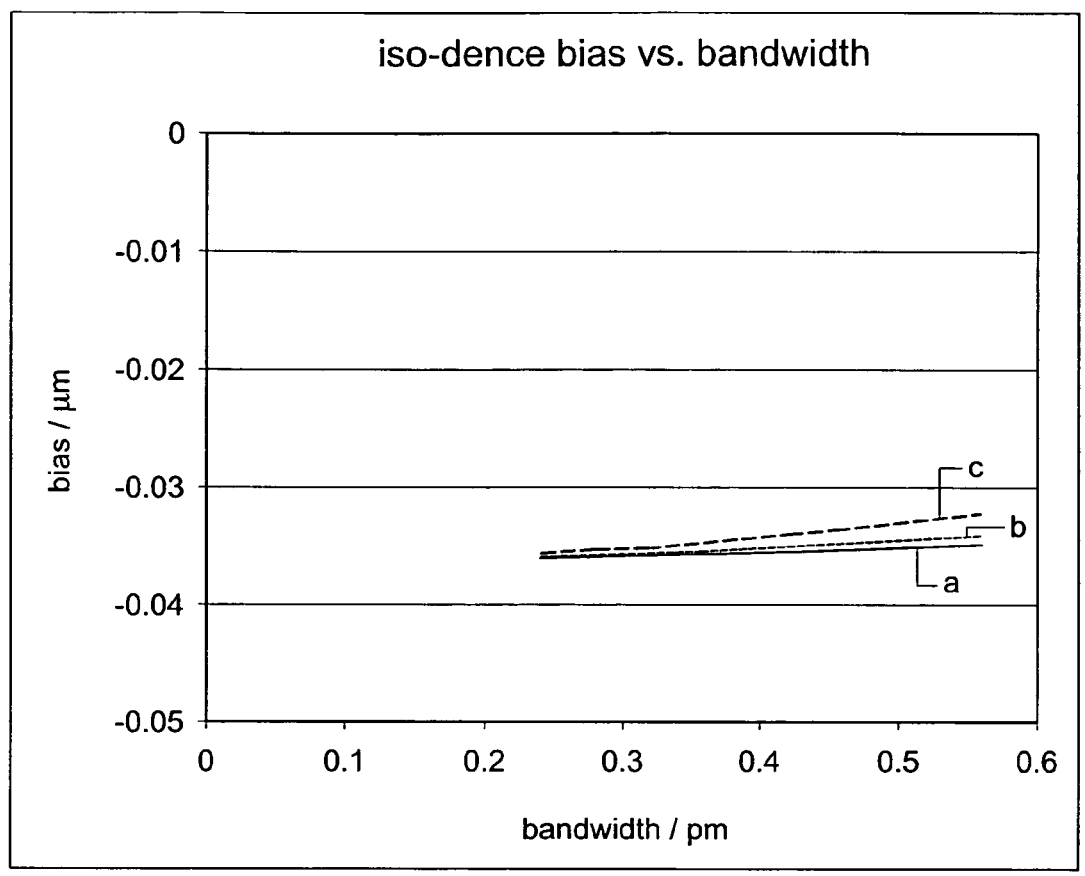
FIG. 4 shows a plot of the iso-dense bias against the bandwidth of the projection beam.

FIG. 4 is a further graph showing the results of the present invention. In particular, FIG. 4 is a plot showing the relationship between the bandwidth of the laser beam incident on the patterning device in picometres and the iso-dense bias of the printed image.

As in FIG. 3, line a shows the results obtained in a 193 nm NA 0.6 lithography apparatus, line b shows the results obtained in a 193 nm NA 0.7 apparatus, and line c shows the results obtained in a 193 nm NA 0.75 apparatus.

FIG. 4 shows that if the bandwidth is slightly increased by between 0.1 and 0.3 picometres by the introduction of an adjustable amount of a second wavelength component in addition to light at the first central lasing wavelength, the iso-dense bias of the resulting image is increased. Hence, according to the present invention, a tuning of iso-dense bias can be provided by a tuning of the proportion of a second radiation component with wavelengths within a small bandwidth centered at and comprising the first radiation component wavelengths.

In the embodiments described above, the amount of ASE in the laser beam was adjusted to tune the iso-dense bias of the resulting printed images. However, the invention is not limited in this respect. In addition to ASE, proportions of other wavelength components in the lasing beam, such as light from a second source or other wavelength components originating from the same source, may be adjusted to achieve similar results.

Figure 5:
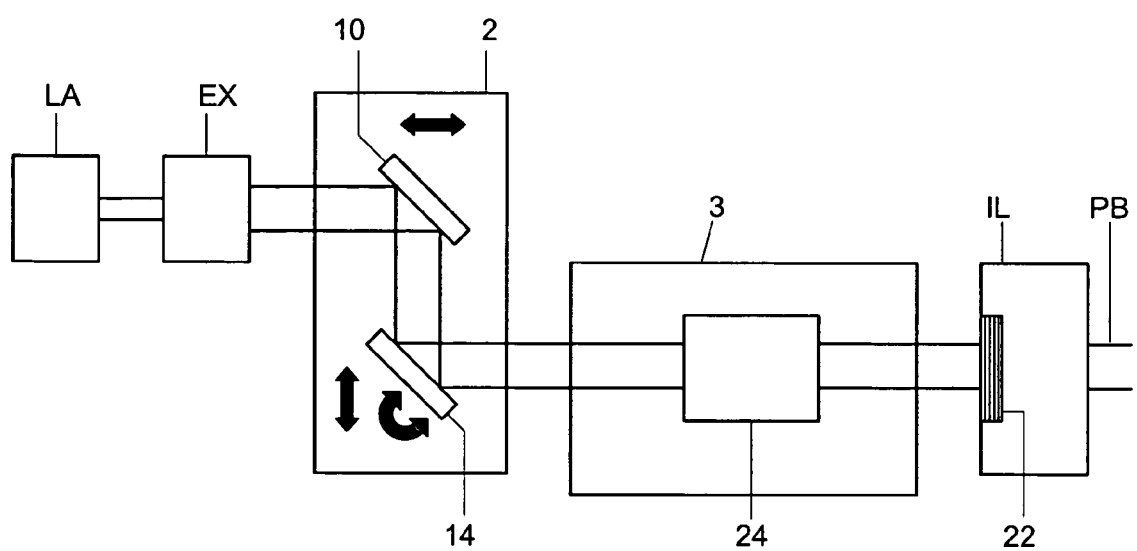
FIG. 5 schematically depicts the radiation source and some elements of the illumination system according to a second embodiment of the invention.

FIG. 5 shows a second embodiment of the present invention. In FIG. 5 the beam expander Ex, the beam delivery system 2 and the illumination unit IL are the same as those described with reference to FIG. 2. In FIG. 5, however, the adjustable filter 3 includes a spectrometer 24. The spectrometer achieves spectral filtering of the projection beam. The inventors of the present invention have realised that by tuning the projection beam to include a filtered range of wavelengths centred around the first wavelength peak of the radiation source, the iso-dense bias can be tuned.

It is commented that changing the laser spectrum may change in addition to the iso-dense bias, other properties of the beam, such as the focus. For example, focus drilling may occur. Under certain circumstances focus drilling may be desired, under other circumstances however, it is not desirable. The present invention allows iso-dense bias to be selectively adjusted without causing focus drilling. The reason for this is that to change the iso-dense bias a certain degree of laser spectrum needs to be changed. To increase the depth of focus, a different, larger degree of change is required to the laser spectrum. Thus by finely controlling the degree of spectrum manipulation, iso-dense bias can be changed without affecting other properties of the laser spectrum.

While specific embodiments of the invention have been described above, it will be appreciated that the invention may be practiced otherwise than as described. The description is not intended to limit the invention.

The invention claimed is:

1. A lithographic apparatus comprising:
   an illumination system configured to condition a beam of radiation, the beam of radiation including a first radiation component having a first spectral band including a first wavelength and a second radiation component having a second spectral band including a second wavelength, wherein the second spectral band has a larger bandwidth than the first spectral band;
   a support structure configured to support a patterning device, the patterning device serving to pattern the beam according to a desired pattern;
   a substrate table configured to hold a substrate;
   a projection system configured to project the patterned beam onto a target portion of the substrate; and
   an adjustable filter, comprising a portion of the illumination system and constructed and arranged to filter the beam of radiation, and being arranged in use to selectively adjust a proportion of the second radiation component relative to the first radiation component in said beam.

2. A lithographic apparatus according to claim 1, wherein the adjustable filter comprises a spatial filter disposed at a location traversed by the beam of radiation.

3. A lithographic apparatus according to claim 2, wherein the illumination system further comprises an optical element configured and arranged to converge the beam at the location.

4. A lithographic apparatus according to claim 1, wherein the adjustable filter comprises a pinhole.

5. A lithographic apparatus according to claim 1, wherein said adjustable filter comprises a spectral filter.

6. A lithographic apparatus according to claim 5, wherein said spectral filter comprises a spectrometer.

7. A lithographic apparatus according to claim 1, wherein the second radiation component includes radiation originating from amplified spontaneous emission from a radiation source.

8. An illumination system configured to receive a beam of radiation including a first radiation component having a first spectral band that includes a first wavelength and a second radiation component having a second spectral band that includes a second wavelength wherein the second spectral band has a larger bandwidth than the first spectral band, the system comprising:
    an adjustable filter configured to filter said beam of radiation, the adjustable filter being arranged in use to selectively adjust a proportion of said second radiation component in said beam.

9. An illumination system according to claim 8, wherein the adjustable filter comprises a spatial filter disposed at a location traversed by said beam of radiation.

10. An illumination system according to claim 9, further comprising an optical element configured and arranged to converge the beam at the location.

11. An illumination system according to claim 8, wherein the adjustable filter comprises a pinhole.

12. An illumination system according to claim 8, wherein said adjustable filter comprises a spectral filter.

13. An illumination system according to claim 12, wherein said spectral filter comprises a spectrometer.

14. An illumination system according to claim 8, wherein the second radiation component includes radiation originating from amplified spontaneous emission from a radiation source.

15. A device manufacturing method comprising:
    providing a beam of radiation including a first radiation component having a first spectral band that includes a first wavelength and a second radiation component having a second spectral band that includes a second wavelength using an illumination system, wherein the second spectral band has a larger bandwidth than the first spectral band;
    patterning the beam with a pattern in its cross-section;
    projecting the patterned beam of radiation onto a target portion of a layer of radiation-sensitive material on a substrate, and
    adjustably filtering the beam of radiation, so as to adjust a proportion of said second radiation component in said beam.

16. A device manufacturing method according to claim 15, comprising adjustably filtering using a spatial filter disposed at a location traversed by the beam of radiation.

17. A device manufacturing method according to claim 16, further comprising converging the beam at the location.

18. A device manufacturing method according to claim 15, comprising adjustably filtering using a pinhole.

19. A device manufacturing method according to claim 15, comprising adjustably filtering using a spectral filter.

20. A device manufacturing method according to claim 19, wherein said spectral filter comprises a spectrometer.

21. A device manufacturing method according to claim 15, wherein the second radiation component includes radiation originating from amplified spontaneous emission from a radiation source.

* * * * *